(12) United States Patent  
Bagheri et al.

(10) Patent No.: US 8,179,167 B2
(45) Date of Patent: May 15, 2012

(54) WIDE BANDWIDTH FAST HOPPING FREQUENCY SYNTHESIZER CIRCUITS AND METHODS

(75) Inventors: Mahdi Bagheri, Carlsbad, CA (US); Ali Karimi-Sanjaaani, Carlsbad, CA (US); Edris Rostami, San Diego, CA (US); Masoud Djafari, Carlsbad, CA (US); Mohammad E. Heidari, Vista, CA (US); Rahim Bagheri, Carlsbad, CA (US)

(73) Assignee: WiLinx Corporation, Carlsbad, CA (US)

( * ) Notice: Subject to any disclaimer, the term of this patent is extended or adjusted under 35 U.S.C. 154(b) by 569 days.

(21) Appl. No.: 12/401,302

(22) Filed: Mar. 10, 2009

(65) Prior Publication Data

US 2010/0233979 A1    Sep. 16, 2010

(51) Int. Cl.
  *H04B 1/18*    (2006.01)
(52) U.S. Cl. ....... 327/105; 327/113; 455/76; 455/183.1; 375/132
(58) Field of Classification Search .......... 375/132–134, 375/306, 375, 376; 455/76, 183.1; 327/105, 327/113
See application file for complete search history.

(56) References Cited

U.S. PATENT DOCUMENTS

| 7,522,898 B2 * | 4/2009 | Heidari et al. ................ 455/255 |
| 7,928,807 B2 * | 4/2011 | Mishra ............................ 331/22 |
| 7,940,830 B2 * | 5/2011 | Marsili et al. ................. 375/134 |
| 2008/0043818 A1 * | 2/2008 | Tal et al. ....................... 375/135 |

* cited by examiner

*Primary Examiner* — Dinh T. Le
(74) *Attorney, Agent, or Firm* — Heimlich Law, PC; Alan Heimlich, Esq.

(57) ABSTRACT

Embodiments of the present invention include methods for wide bandwidth synthesizer circuits and methods. In one embodiment, the present invention includes a frequency synthesizer comprising a multiplexer and a band group selector. The multiplexer is coupled to receive a plurality of sinusoidal signals. Each sinusoidal signal has a unique frequency. The band group selector selects between a plurality of band groups. The band group selector is coupled to receive a first signal from the multiplexer. The multiplexer multiplexes between the plurality of sinusoidal signals and provides the first signal. The band group selector includes a band mixer. The band mixer mixes the first signal with a band signal having a band frequency. The band signal corresponds to a band group selected from the plurality of band groups. The band group selector provides a transmitter mixer signal and a receiver mixer signal.

18 Claims, 5 Drawing Sheets

WIDE BANDWIDTH FAST HOPPING FREQUENCY SYNTHESIZER CIRCUITS AND METHODS

CROSS REFERENCE TO RELATED APPLICATIONS

Not applicable.

BACKGROUND

The present invention relates to frequency synthesizers, and in particular, to wide bandwidth fast hopping frequency synthesizer circuits and methods.

Many electronic systems require signals at a variety of different frequencies to perform a variety of different functions. In many situations, a system will include some reference frequency (sometimes referred to as the system frequency). An example of such a reference frequency is a system clock. The reference frequency often provides the foundation timing reference for the system. However, many system components and subsystems may require different frequency signals to operate properly. In many cases, subsystem frequencies may vary drastically from the reference, or may have different tolerances or other unique requirements that the reference frequency cannot meet. Thus, frequency generation, which is sometimes referred to as frequency synthesis, is an important consideration in the design and development of electronic systems.

Many communication systems utilize mixers to transmit electromagnetic signals. Mixers inherently have nonlinearities which may generate spurs. High frequency synthesizers may utilize several mixers which may introduce spurs spreading over a wide bandwidth. This especially becomes a problem when bandwidths are restricted by government regulation. For example, Europe and Japan have a restricted bandwidth between 4.8 Ghz and 5 Ghz. Commercial products cannot produce carrier frequencies within this band nor can they produce any significant spur within this band. Therefore spurs can limit government compliance or may limit the usable bandwidth available.

Thus, there is a need for new frequency synthesizers. The present invention solves these and other problems by providing wide bandwidth fast frequency hopping synthesizer circuits and methods where the synthesizer output can hop over a very wide bandwidth with minimal spurious generation. In one embodiment, the frequency hopping time of proposed solution is few nanoseconds

SUMMARY

Embodiments of the present invention include a frequency synthesizer comprising a multiplexer and a band group selector. The multiplexer is coupled to receive a plurality of sinusoidal signals. Each sinusoidal signal has a unique frequency. The band group selector selects between a plurality of band groups. The band group selector is coupled to receive a first signal from the multiplexer. The multiplexer multiplexes between the plurality of sinusoidal signals and provides the first signal. The band group selector includes a band mixer. The band mixer mixes the first signal with a band signal having a band frequency. The band signal corresponds to a band group selected from the plurality of band groups. The band group selector provides a transmitter mixer signal and a receiver mixer signal.

In one embodiment, the unique frequency corresponds to a first multiple of a base frequency. The band frequency corresponds to a second multiple of the base frequency. The second multiple is greater than the first multiple.

In one embodiment, the frequency synthesizer further comprises a phase locked loop. The phase locked loop generates the band signal for a first band group and a second band group. A band mixer of the first band group mixes the first signal with the band signal resulting in the second signal having a first frequency corresponding to the second multiple minus the first multiple. A band mixer of the second band group mixes the first signal with the band signal resulting in the second signal having a second frequency corresponding to the second multiple plus the first multiple.

In one embodiment, a band mixer of the fourth band group mixes the first signal with the second band group signal resulting in the second signal having a second frequency corresponding to the third multiple plus the first multiple.

In one embodiment, the phase locked loop generates a second band signal for a third band group. The third band group utilizes the band mixer of the second band group to mix the first signal with the second band signal resulting in the second signal having a third frequency corresponding to a third multiple plus the first multiple. The second band signal is generated by the phase locked when the third band group becomes the band group selected.

In one embodiment, each band group of the plurality of band groups includes tuning loads which are altered according to each sinusoidal signal multiplexed within each bandwidth corresponding to each band group. The tuning loads are multiplexed simultaneously with the multiplexer such that a unique tuning load corresponds to each sinusoidal signal multiplexed and the band group selected. The unique tuning load filters out spurious signals In one embodiment, the sinusoidal signals, the first signal, the second signal, the band signal, the transmitter mixer signal, and the receiver mixer signal are differential quadrature signals. Each tuning load is a differential tuning load. Each differential tuning load comprises a differential inductor and a plurality of adjustable metal oxide semiconductor (MOS) capacitor pairs. The differential inductor has a first terminal, a second terminal, and a center tap terminal. The center tap terminal is coupled to a first reference voltage. The plurality of adjustable metal oxide semiconductor capacitor pairs are arranged in parallel. Each metal oxide semiconductor capacitor pair comprises a first and a second MOS capacitor and a first and second switch. The first metal oxide semiconductor capacitor has a channel terminal and a gate terminal. The gate terminal is coupled to the first terminal of the differential inductor. The second metal oxide semiconductor capacitor has a channel terminal coupled to the channel terminal of the first metal oxide semiconductor capacitor and a gate terminal coupled to the second terminal of the differential inductor. The first switch has a first terminal coupled to a second reference voltage and a second terminal coupled to the channel terminal of the first and second metal oxide semiconductor capacitors. The second switch has a first terminal coupled to a third reference voltage and a second terminal coupled to the channel terminal of the first and second metal oxide semiconductor capacitors. Each metal oxide semiconductor capacitor pair is selectively switched such that the load may be tuned.

In one embodiment, each band group of the plurality of band groups includes bias settings of stages which are altered according to each sinusoidal signal multiplexed within each bandwidth corresponding to each band group. The bias settings are multiplexed simultaneously with the multiplexer such that a unique biasing corresponds to each sinusoidal signal multiplexed and the band group selected.

In one embodiment, the band group selector includes a signal branch for each band group and a wideband buffer coupled to an output of each signal branch. The wideband buffer provides the transmitter mixer signal and the receiver mixer signal corresponding to the band group selected. A signal branch corresponding to the band group selected is the only signal branch powered.

In one embodiment, the invention includes a method of synthesizing signals comprising selecting, multiplexing, mixing, and coupling. The selecting includes selecting a band group from a plurality of band groups. Each band group has a corresponding bandwidth and a band signal having a band frequency. The selecting results in a selected band group. The multiplexing includes multiplexing between the sinusoidal signals of a plurality of sinusoidal signals. Each sinusoidal signal has a unique frequency. The multiplexing results in a first signal. The mixing includes mixing the first signal with a band signal corresponding to the selected band group. The band signal has a band frequency. The mixing results in a second signal. The coupling includes coupling the second signal to provide the transmitter mixer signal and the receiver mixer signal.

In one embodiment, the unique frequency corresponds to a first multiple of a base frequency. The band frequency corresponds to a second multiple of the base frequency. The second multiple is greater than the first multiple.

In one embodiment, the mixing the first signal further includes mixing the first signal according to a first band group and mixing the first signal according to a second band group. The mixing the first signal according to a first band group includes mixing such that the second signal has a first frequency corresponding to the second multiple minus the first multiple. The mixing the first signal according to a second band group includes mixing such that the second signal has a second frequency corresponding to the second multiple plus the first multiple. The plurality of band groups includes the first band group and the second band group. The mixing depends on the band group selected.

In one embodiment, the method further comprises tuning loads and multiplexing. The tuning results in a plurality of sets of tuned loads. Each set of tuned loads corresponds to each sinusoidal signal within each bandwidth corresponding to each band group. The multiplexing includes multiplexing between the plurality of sets of tuned loads simultaneously with the multiplexing between the sinusoidal signals of the plurality of sinusoidal signals such that each set of tuned loads corresponds to each sinusoidal signal and the band group selected.

In one embodiment, the method further comprises setting biases and multiplexing. The setting results in a plurality of sets of bias settings. Each set of bias settings corresponds to each sinusoidal signal within each bandwidth corresponding to each band group. The multiplexing between the sets of the plurality of sets of bias settings simultaneously with the multiplexing between the sinusoidal signals of the plurality of sinusoidal signals such that each set of biasing settings corresponds to each sinusoidal signal and the band group selected.

In one embodiment, the setting biases changes the gain of a mixer corresponding to a signal path of the band group selected.

In one embodiment, the setting biases changes the gain of a stage corresponding to a signal path of the band group selected.

Additional embodiments will be evident from the following detailed description and accompanying drawings, which provide a better understanding of the nature and advantages of the present invention.

DETAILED DESCRIPTION

Described herein are techniques for wide bandwidth synthesizer circuits and methods. In the following description, for purposes of explanation, numerous examples and specific details are set forth in order to provide a thorough understanding of the present invention. It will be evident, however, to one skilled in the art that the present invention as defined by the claims may include some or all of the features in these examples alone or in combination with other features described below, and may further include obvious modifications and equivalents of the features and concepts described herein.

Figure 1:
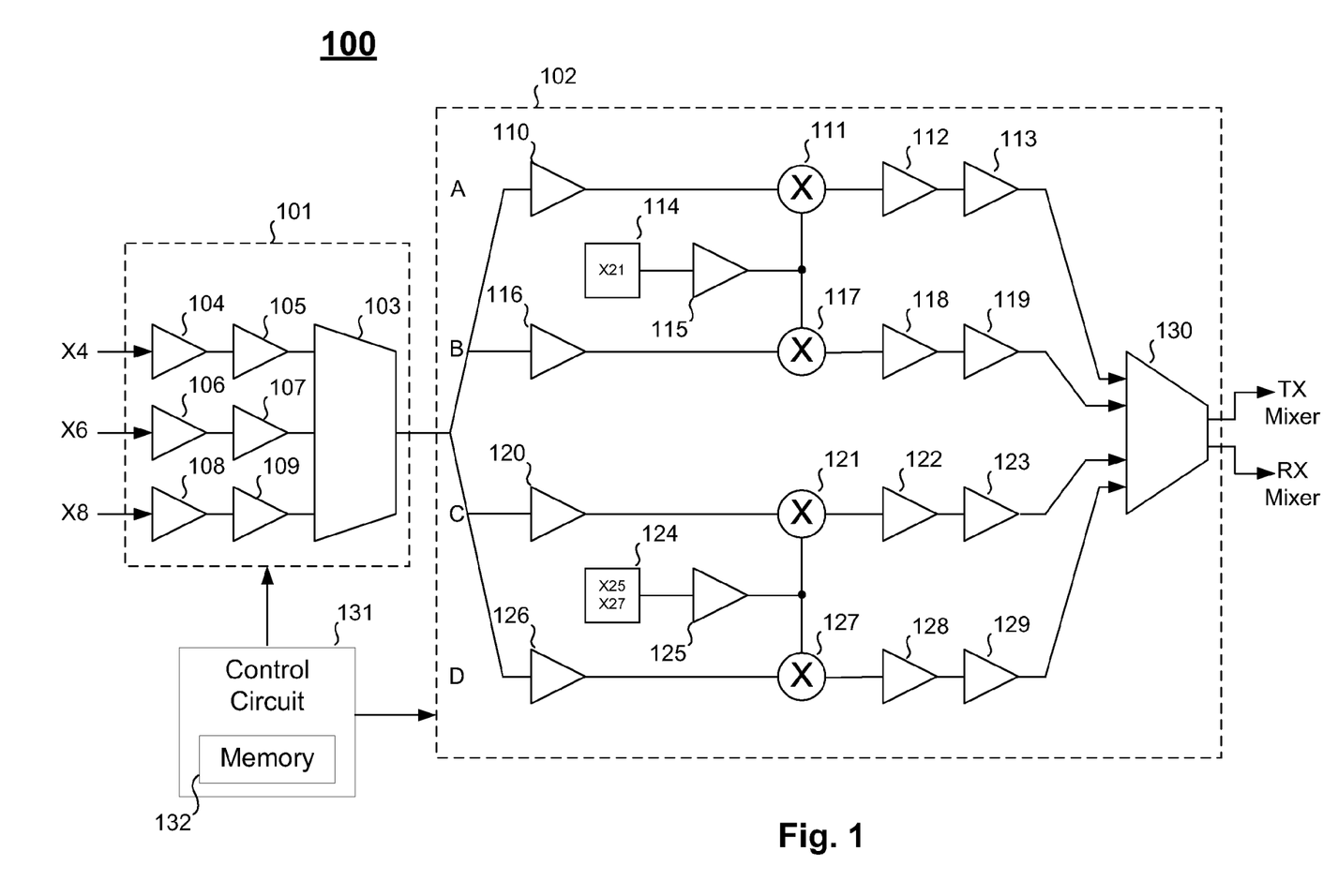
FIG. 1 illustrates a wide bandwidth synthesizer circuit according to one embodiment of the present invention.

FIG. 1 illustrates a wide bandwidth synthesizer circuit 100 according to one embodiment of the present invention. Wide bandwidth synthesizer circuit 100 includes a multiplexer 101, a band group selector 102, and control circuitry 131. The multiplexer 101 receives a plurality of sinusoidal signals. Each sinusoidal signal has a unique frequency. The frequencies of the sinusoidal signals may be multiples of a base frequency such as 264 Mhz, for example. The frequencies may be the base frequency times the multiple of four (×4), the base frequency times the multiple of six (×6), and the base frequency times the multiple of eight (×8), and/or multiple of two. The multiplexer 101 may multiplex the sinusoidal signals according to a routine designed to multiplex through the frequencies in a predetermined order. This routine may be executed by control circuitry 131. Control circuitry 131 includes memory 132. In one embodiment, the multiplexing may be controlled by control circuitry 131 and changed according to a routine loaded in memory 132 which may input other data concerning the transmission or reception of a signal. For example, a sinusoidal signal may be utilized less due to reception errors resulting from interference in a frequency band corresponding to the sinusoidal signal, for example. The order of multiplexing and the time each sinusoidal signal is utilized may be changed interactively within a program according to a protocol, for example. The multiplexer 101 includes a selector 103 and stages 104-109. Stages 104-109 isolate the sources (×4, ×6, ×8) of sinusoidal signals from the selector 103 which switches between the sinusoidal signals. The selector may need to switch in less than 3 ns for some applications. The stages 104-109 may help to maintain the loading on the sources (×2, ×4, ×6, ×8) of the sinusoidal signals. The multiplexer provides a single output signal. In one embodiment, the synthesizer circuit 100 may be a quadrature synthesizer and the single output signal may include a differential in-phase component and a differential quadrature phase component. The sources of the sinusoidal signals may be voltage controlled oscillator (VCO) rings and may also provide a quadrature signal, for example. In this example, the stages of the synthesizer circuit 100 may include circuitry for quadrature signals.

Band group selector 102 includes stage 110, stage 112, stage 113, stage 115, stage 116, stage 118, stage 119, stage 120, stage 122, stage 123, stage 125, stage 126, stage 127, stage 128, stage 129, mixers 111, mixer 117, mixer 121, mixer, 127, frequency source 114, frequency source 124 and 114, and wideband buffer 130. These elements may be designed for differential quadrature signals. Band group selector 102 selects between branches A-D and the frequencies utilized by frequency source 124. The selection may be approximately 5 uS. A band group may be selected for a multiple signal transmissions and signal receptions. A differential quadrature signal may include a positive in-phase component, a negative in-phase component, a positive quadrature phase component, and a negative quadrature phase component. Stages 110, 116, 120, and 126 provide drive for signal branch A, B, C, and D respectively. This may help to fan out the multiplexed signal provided to the band group selector 102 from the multiplexer 101. The stages may be buffers or amplifiers. The wideband buffer 130 couples the selected band group signal to provide an input to a transmitter mixer and an input to a receiver mixer.

Signal branch A includes stage 110, mixer 111, stage 112, stage 113, stage 115, and frequency source 114, and wideband buffer 130. Signal branch A may be the only branch powered when band group 1 is selected by the control circuitry 131. Stage 110 provides drive for the multiplexed signal. Frequency source 114 provides a band signal having a band frequency corresponding to the base frequency time a multiple of 21 (×21). The frequency source 114 may be a phase locked loop (PLL). The stage 115 helps to isolate the frequency source 114 from mixer 111 and mixer 117. Mixer 111 mixes the multiplexed signal with the band signal such that the output of the mixer 111 includes a signal having a frequency corresponding to the multiple of the band signal minus the multiple of the each of the sinusoidal signals being multiplexed (i.e. ×4, ×6, and ×8). This set of frequencies may make up a band group associated with signal branch A. For example, if the base frequency is 264 Mhz, the corresponding band group would be:

Band Group 1

(21−8)*264 Mhz=(13)*264 Mhz=3.432 Ghz (21−6)*264 Mhz=(15)*264 Mhz=3.960 Ghz (21−4)*264 Mhz=(17)*264 Mhz=4.488 Ghz

The frequency synthesizer may hop between these signals (3.432 Ghz, 3.960 Ghz, and 4.488 Ghz) when band group 1 is selected and the multiplexer is multiplexing between the sinusoidal signals (×4, ×6, ×8).

Mixer 111, stage 112, and stage 113 may all have tunable loads which may provide filtering of any spurious signals. These tuning loads may be multiplexed simultaneously with the multiplexer such that a unique tuning load corresponds to each sinusoidal signal multiplexed and the band group selected. For example, the output of 3.432 Ghz may have one tuning load (associated with mixer 111) having a single pole at 4 Ghz, a second tuning load (associated with stage 112) with a single pole at 4.1 Ghz, and a third tuning load (associated with stage 113) with a single pole at 3.95 Ghz. Together the three tuning loads provide a multiple pole low pass filter response which will filter out spurious signals. The output of 3.960 Ghz may have a different set of values defining a second set of tuning loads corresponding to this frequency output. The output of 4.488 Ghz may have a different set of values defining a third set of tuning loads corresponding to this frequency output. Each set of values may be multiplexed simultaneously with the multiplexer such that spurious signals may be filtered out at each frequency in the band group selected.

Mixer 111, stage 112, and stage 113 may all have adjustable bias settings which may provide gain adjustments so that the signals take advantage of the full dynamic range of the circuit. This may help to improve the signal to noise ratio of the design. These bias settings may be multiplexed simultaneously with the multiplexer such that a unique biasing corresponds to each sinusoidal signal multiplexed and the band group selected. For example, the output of 3.432 Ghz may have a low signal so a first biasing (associated with mixer 111) increases the amplitude of the signal, a second biasing (associated with stage 112) may need to have a reduced biasing to maintain compliance within the dynamic range of stage 112, and a third biasing (associated with stage 113) may be adjusted to compensate for the tuning load attenuation associated with stage 113 of this band group, for example. Together the biasing adjustments to mixer 111, stage 112, and stage 113 may provide amplitude adjustment to fully utilize the dynamic range of the signal path. The output of 3.960 Ghz may have a different set of values defining a second set of biasing values corresponding to this frequency output. The output of 4.488 Ghz may have a different set of values defining a third set of biasing values corresponding to this frequency output. Each set of values may be multiplexed simultaneously with the multiplexer such that the signals utilize the dynamic range of the signal path for each frequency in the band group selected.

Signal branch B includes stage 116, mixer 117, stage 118, stage 119, stage 115, and frequency source 114, and wideband buffer 130. Signal branch B may be the only branch powered when band group 3 is selected by the control circuitry 131. Stage 116 provides drive for the multiplexed signal. Frequency source 114 provides a band signal having a band frequency corresponding to the base frequency time a multiple of 21 (×21). Mixer 117 mixes the multiplexed signal with the band signal such that the output of the mixer 117 includes a signal having a frequency corresponding to the multiple of the band signal plus the multiple of the each of the sinusoidal signals being multiplexed (i.e. ×4, ×6, and ×8). This set of frequencies may make up a band group associated with signal branch B. For example, if the base frequency is 264 Mhz, the corresponding band group would be:

Band Group 3

(21+4)*264 Mhz=(25)*264 Mhz=6.600 Ghz (21+6)*264 Mhz=(27)*264 Mhz=7.128 Ghz (21+8)*264 Mhz=(29)*264 Mhz=7.656 Ghz

The frequency synthesizer may hop between these signals (6.600 Ghz, 7.128 Ghz, and 7.656 Ghz) when band group 3 is selected and the multiplexer is multiplexing between the sinusoidal signals (×4, ×6, ×8).

Mixer 117, stage 118, and stage 119 may all have tunable loads which may provide filtering of any spurious signals. These tuning loads may operate similar to the tuning loads described above. These tuning loads may have a set of values for every frequency in band group 3 (ie. 6.600 Ghz, 7.128

Ghz, and 7.656 Ghz). These sets of values may be multiplexed simultaneously with the multiplexer such that a unique tuning load corresponds to each sinusoidal signal multiplexed and the band group selected.

Mixer 117, stage 118, and stage 119 may all have adjustable bias settings which may provide gain adjustments so that the signals take advantage of the full dynamic range of the circuit. This may help to improve the signal to noise ratio of the design. The bias settings may operate similar to the bias settings described above. Each set of values may be multiplexed simultaneously with the multiplexer such that the signals utilize the dynamic range of the signal path for each frequency in the band group selected.

Signal branch C includes stage 120, mixer 121, stage 122, stage 123, stage 125, and frequency source 124, and wideband buffer 130. Signal branch C may be the only branch powered when band group 2 is selected by the control circuitry 131. Signal branch C may operate similar to signal branch A. For example, mixer 121, stage 122, and stage 123 may have tunable loads and adjustable bias settings which may be multiplexed simultaneously with the multiplexer. These tunable loads and adjustable bias setting may operate similar to the tunable loads and adjustable bias settings described above.

Signal branch C includes a frequency source 124 that has a selectable band frequency. Frequency source 124 provides a band signal having a band frequency corresponding to the base frequency time a multiple of 25 (×21) or a multiple of 27 (×27). In this embodiment, only the (×27) band signal is utilized. If the base frequency is 264 Mhz, the corresponding band group would be:

Band Group 2

(27−8)*264 Mhz=(19)*264 Mhz=5.016 Ghz (27−6)*264 Mhz=(21)*264 Mhz=5.544 Ghz (27−4)*264 Mhz=(23)*264 Mhz=6.072 Ghz

The frequency synthesizer may hop between these signals (5.016 Ghz, 5.544 Ghz, and 6.072 Ghz) when band group 2 is selected and the multiplexer is multiplexing between the sinusoidal signals (×4, ×6, ×8).

Signal branch D includes stage 126, mixer 127, stage 128, stage 129, stage 125, and frequency source 124, and wideband buffer 130. Signal branch D may be the only branch powered when band group 4 or band group 6 are selected by the control circuitry 131. Signal branch D may operate similar to signal branch B. For example, mixer 127, stage 128, and stage 129 may have tunable loads and adjustable bias settings which may be multiplexed simultaneously with the multiplexer. These tunable loads and adjustable bias setting may operate similar to the tunable loads and adjustable bias settings described above.

Signal branch D includes a frequency source 124 that has a selectable band frequency. Frequency source 124 provides a band signal having a band frequency corresponding to the base frequency time a multiple of 25 (×21) or a multiple of 27 (×27). In this embodiment, both frequencies are utilized to generate band group 4 and band group 6. Band group 4 utilizes (×27) and band group 6 utilizes (×25) from the frequency source 124. The frequency source may be a phase locked loop (PLL). If the base frequency is 264 Mhz, band group 4 would be:

Band Group 4

(27+4)*264 Mhz=(31)*264 Mhz=8.184 Ghz (27+6)*264 Mhz=(33)*264 Mhz=8.712 Ghz (27+8)*264 Mhz=(35)*264 Mhz=9.240 Ghz

The frequency synthesizer may hop between these signals (8.184 Ghz, 8.712 Ghz, and 9.240 Ghz) when band group 4 is selected and the multiplexer is multiplexing between the sinusoidal signals (×4, ×6, ×8).

If the base frequency is 264 Mhz, band group 6 would be:

Band Group 6

(25+4)*264 Mhz=(29)*264 Mhz=7.656 Ghz (25+6)*264 Mhz=(31)*264 Mhz=8.184 Ghz (25+8)*264 Mhz=(33)*264 Mhz=8.712 Ghz

The frequency synthesizer may hop between these signals (7.656 Ghz, 8.184 Ghz, and 8.712 Ghz) when band group 6 is selected and the multiplexer is multiplexing between the sinusoidal signals (×4, ×6, ×8).

Figure 2A:
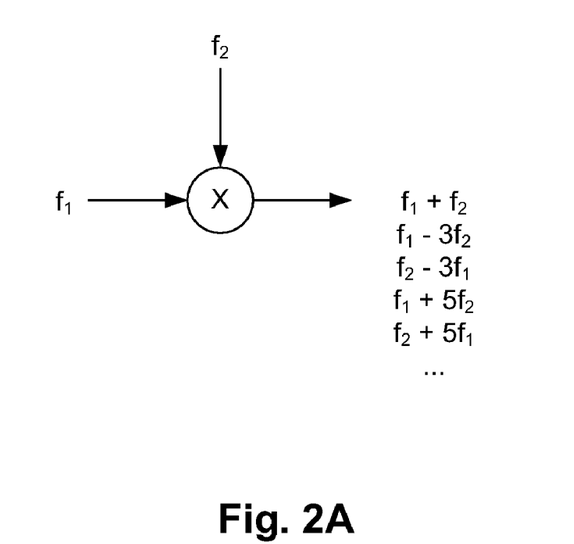
FIGS. 2A-B illustrate frequency content of mixers.
Figure 2B:
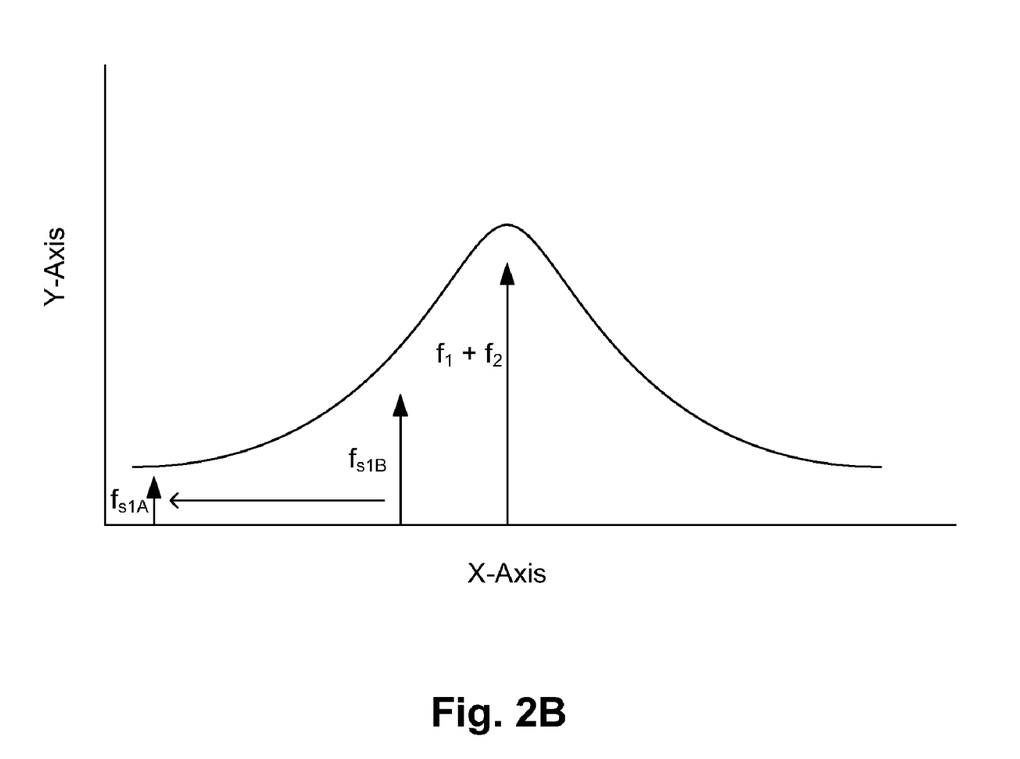

FIGS. 2A-B illustrate frequency content of mixers. FIG. 2A illustrates the frequency content at the output of a summing mixer receiving frequencies $f_1$ and $f_2$ on the mixer inputs. The primary frequency component (i.e., the fundamental) is the sum of the two input frequencies (i.e., $f_1+f_2$). However, a summing mixer also generates additional frequencies components (i.e., sidebands) at the absolute value of the following frequencies: $f_1-3f_2$, $f_2-3f_1$, $f_1+5f_2$, $f_2+5f_1$, etc. . . .

In one embodiment of the present invention, the frequencies used as inputs to the mixers are maximally separated in frequency so that the frequencies of the sidebands are far away from the frequency of the fundamental mixer output frequency. One advantage of this technique is illustrated in FIG. 2B. FIG. 2B illustrates a fundamental mixer output frequency $f_1+f_2$. It is often desirable to include filter circuits in the synthesizer (e.g., in the mixer) that pass the fundamental but attenuate the sidebands. By selecting maximally separated input frequencies for the mixer from the available frequencies to generate the desired fundamental mixer output frequency, the sidebands are moved farther away in frequency from the fundamental and the sidebands are more easily attenuated (or equivalently, lower Q filters may be used). For example, in FIG. 2B sideband frequency $f_{s1B}$ may be moved farther away from the fundamental to $f_{s1A}$ by selecting different input frequencies for the mixer from the available input frequencies.

For example, if the desired output frequency of a mixer is $f_o=15f_b$ (i.e., the desired output is fifteen (15) times some base frequency) and the following four (4) frequencies are available in the system $[f_1=3f_b, f_2=7f_b, f_3=8f_b, f_4=12f_b]$, then the desired output may be achieved either by adding $f_2$ and $f_3$ (i.e., $7f_b+8f_b=15f_b$) or $f_1$ and $f_4$ (i.e., $3f_b+12f_b=15f_b$). The sidebands generated by adding $f_1$ and $f_4$ are as follows:

$$f_{s1A}=f_1-3f_4=|3f_b-3(12f_b)|=33f_b$$

$$f_{s1A}=f_4-3f_1=12f_b-3(3f_b)=3f_b$$

$$f_{s1A}=f_1+5f_4=3f_b+5(12f_b)=63f_b$$

$$f_{s1A}=f_4+5f_1=12f_b+5(3f_b)=27f_b$$

However, the sidebands generated by adding $f_2$ and $f_3$ are as follows:

$$f_{s1B}=f_2-3f_3=|7f_b-3(8f_b)|=17f_b$$

$$f_{s1B}=f_3-3f_2=|8f_b-3(7f_b)|=13f_b$$

$$f_{s1B}=f_2+5f_3=7f_b+5(8f_b)=47f_b$$

$f_{s1B}=f_3+5f_2=8f_b+5(7f_b)=42f_b$

Thus, the closest sideband to the desired fundamental (i.e., $15f_b$) is $f_{s1A}=27f_b$ when $f_1$ and $f_4$ are used as mixer inputs, which is $12f_b$ away from the fundamental (i.e., $27f_b-15f_b=12f_b$). On the other hand, the closest sideband to desired fundamental (i.e., $15f_b$) is $f_{s1B}=13f_b$ when $f_2$ and $f_3$ are used as mixer inputs, which is only $2f_b$ away from the fundamental (i.e., $15f_b-13f_b=2f_b$). Consequently, a higher Q filter would be required to pass the fundamental and attenuate the sideband if $f_2$ and $f_3$ are used as mixer inputs than if $f_1$ and $f_4$ are used as mixer inputs.

Figure 3:
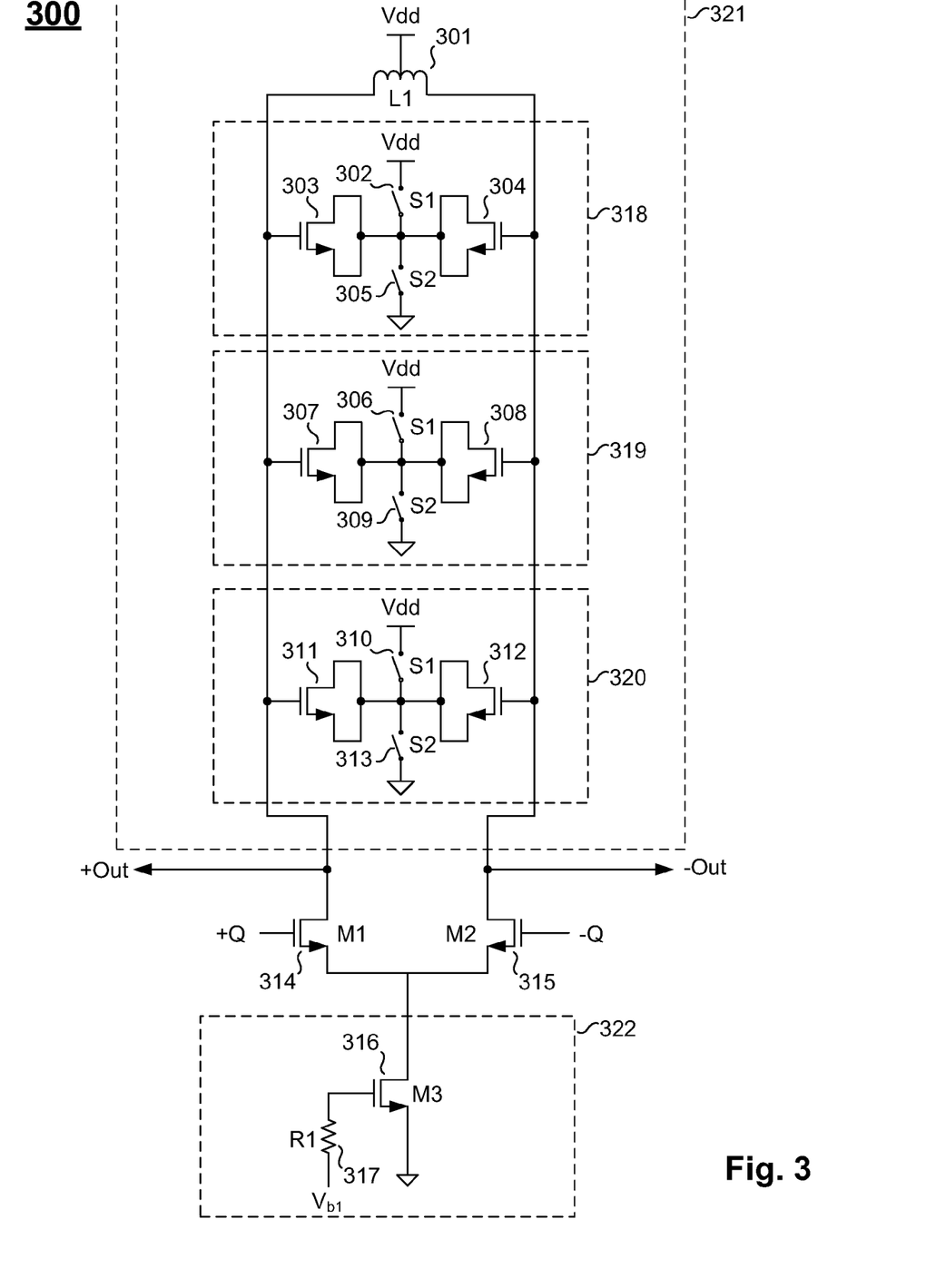
FIG. 3 illustrates a circuit which is part of a stage according to one embodiment of the present invention.

FIG. 3 illustrates a circuit 300 which is part of a stage according to one embodiment of the present invention. Circuit 300 may amplify a differential quadrature phase component (+Q, −Q) of a differential orthogonal signal. Circuit 300 may be part of system which utilizes differential orthogonal signals such that the stages, the mixers, the multiplexers, and the wideband buffer described in FIG. 1 above may all be differential orthogonal circuits. Circuit 300 includes a tuning load 321, a differential pair of transistors (314, 315), and a current source 322. The gate terminal of transistor 314 and the gate terminal of transistor 315 receive the differential quadrature phase component (+Q, −Q). The source terminal of transistor 314 and the source terminal of transistor 315 are coupled to the current source 322. The drain terminal of transistor 314 and the drain terminal of transistor 315 provide a differential output signal corresponding to the differential quadrature phase component (+Q, −Q). The drain terminal of transistor 314 is coupled to the +Out terminal of the differential tuning load 322. And the drain terminal of transistor 315 is coupled to the −Out terminal of the differential tuning load 322. The differential tuning load 322 includes differential inductor 301, a plurality of metal oxide semiconductor (MOS) capacitor pairs (318-320). Reference voltage Vdd provides current to circuit 300. Vdd is coupled to a center tap of differential inductor 301. One terminal of differential inductor 301 is coupled to the +Out terminal of the differential tuning load 322. The other terminal of differential inductor 301 is coupled to the −Out terminal of the differential tuning load 322. The MOS capacitor pairs (318-320) are coupled in parallel with the differential inductor.

MOS capacitor pair 318 includes transistor 303, transistor 304, switch 302, and switch 305. The gate terminal of transistor 303 is coupled to the +Out terminal and establishes one end of MOS capacitor pair 318. The source and drain terminal of transistor 303 are coupled together to one terminal of switch 302 and to one terminal of switch 305. The other terminal of switch 302 is coupled to Vdd. The other terminal of switch 305 is coupled to ground. The gate terminal of transistor 304 is coupled to the −Out terminal and establishes the other end of the MOS capacitor pair 318. The source and drain terminal of transistor 304 are coupled together to the drain and source terminal of transistor 303. When switch 302 is closed and switch 305 is opened, the capacitance at the +Out and −Out terminal is due to secondary parasitic capacitances. When switch 302 is opened and switch 305 is closed, the capacitance at the +Out and −Out terminal is a matched capacitance corresponding to the gate capacitance of transistor 303 and transistor 304. The switching of the gate capacitances alters the capacitance of the load.

MOS capacitor pair 319 and MOS capacitor pair 320 may be coupled similarly to MOS capacitor pair 318 and therefore operate in the same manner described above. MOS capacitor pair 319 includes transistor 307, transistor 308, switch 306, and switch 309. MOS capacitor pair 320 includes transistor 311, transistor 312, switch 310, and switch 313.

The capacitor pairs 318-320 may be switched in a digital mode so that the tuning load 321 may have eight combination of capacitance values. These combinations may help to change the center frequency of a band pass filter (BPF) formed by the differential inductor 301 and the plurality of differential capacitor pairs 318-320. This may allow for adjustment of the BPF over a band of frequencies defined by a band group selected. For example, in FIG. 1 described above, band group 1 may use signal branch A with a designed first set of inductors and differential capacitor pairs, while band group 3 may use signal branch B with a designed second set of inductors and differential capacitor pairs. The tuning load combinations for signal branch A may be optimized for band group 1, and the tuning load combinations for signal branch B may be optimized for band group 3. A universal tuning load may be impractical due to the small inductance required to meet the range requirements for all band groups. This may dissipate excessive power and limit the usable bandwidth of the frequency synthesizer.

Current source 322 includes transistor 316 and resistor 317. The current source may provide a current that defines the gain of circuit 300. Transistor 316 has drain terminal coupled to the source terminal of transistor 314 and the source terminal of transistor 315, and these two transistors may steer the current from the current source based on the signal provided (+Q,−Q). The source of transistor 316 may be coupled to a reference voltage such as ground, for example. Resistor 317 couples the gate of transistor 316 to a biasing source $V_{b1}$.

Source $V_{b1}$. may have a set of programmed values for circuit 300. These programmed values may change the gain of circuit 300 such that the output differential signal (+Out,−Out) remains within the voltage rails (e.g. Vdd and ground) and remains in the linear region of the transistors (314-316). These setting may be programmed during a power on sequence which calibrates circuit 300 as well as the other similar circuits of the frequency synthesizer. This calibration may determine the optimum value of tuning loads needed and an associated value of bias values used to reduce the various spurs and maintain a signal which utilizes the dynamic range of the circuits of the stages.

Figure 4:
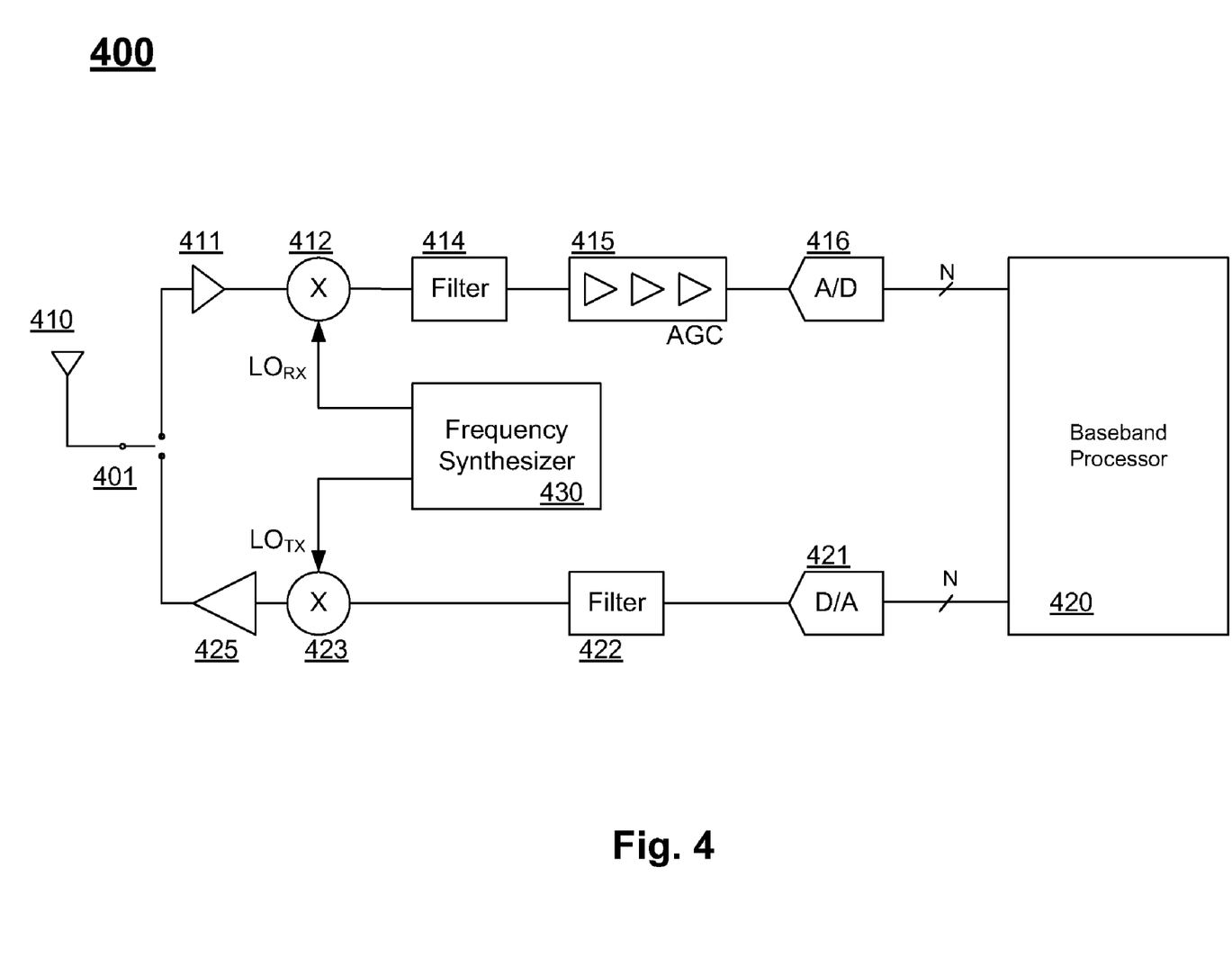
FIG. 4 illustrates a wireless system that may use frequency synthesizer circuits and methods of the present invention.

FIG. 4 illustrates a wireless system that may use frequency synthesizer circuits and methods of the present invention. FIG. 4 is an example of a direct conversion architecture that may use embodiments of the present invention. Wireless system 400 includes antenna 410 coupled through a switch 401 to both a reception channel and a transmission channel. The reception channel includes a low noise amplifier 411 ("LNA"), mixer 412, frequency synthesizer 430, filter 414, automatic gain control 415 ("AGC") and analog-to-digital converter 416 ("A/D"). LNA 411 is used for amplifying high frequency signals from antenna 410 and must have sufficient bandwidth, gain and noise performance to meet system requirements. The reception channel may include two mixers and parallel paths thereafter for both in phase and quadrature paths (only one path is shown). Mixer 412 receives a receiver oscillator signal ("LORx") from frequency synthesizer 430 at the carrier frequency and demodulates the RF input signal from the LNA 411. In a direct conversion system, the input signal is demodulated down to baseband, and no intermediate frequencies are used. It is to be understood that embodiments of the present invention may be used in either a direct conversion system or a system using intermediate frequencies. Filter 414 is used to extract the signal of interest from the demodulated signal, and AGC 415 provides appropriate gain so that the input to A/D 416 is as close as possible to the A/D's full range. The output of the reception channel is coupled to baseband processor 420 over N-bit digital signal lines, for example, for decoding and further processing.

During transmission, baseband processor 420 encodes a voice or data signal. The encoded signal is received by digital-to-analog converter 421 ("D/A") as an N-bit digital signal, for example, and is converted into an analog signal. The output of D/A 421 is passed through filter 422 and mixer 423. Mixer 423 receives a transmitter oscillator signal ("$LO_{TX}$") from frequency synthesizer 430 at the carrier frequency, and the input to the mixer is modulated by LO to produce a modulated output signal. The system may include two transmission paths for both in-phase and quadrature signals (not shown). The modulated mixer output signal is received by power amplifier 425, which amplifies the power in the signal to drive antenna 410.

Figure 5:
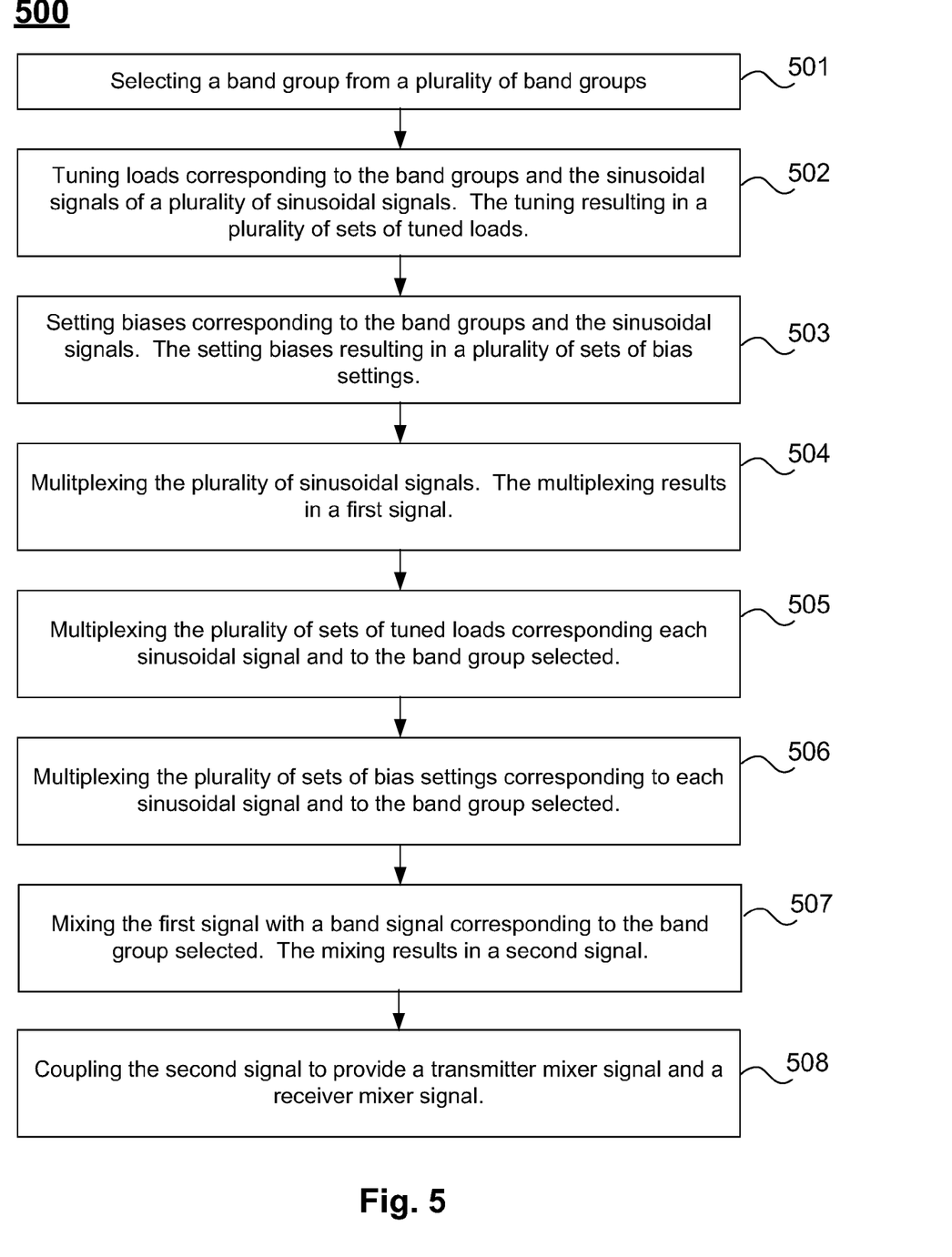
FIG. 5 illustrates a method according to another embodiment of the present invention.

FIG. 5 illustrates a method 500 according to another embodiment of the present invention.

At 501, the band group is selected from a plurality of band groups. The band group may define a bandwidth of frequencies which may be utilized by a user. The band groups may be overlapping. The band groups may be selected according to governmental regulation. The selection may be preprogrammed or may be selectable through software.

At 502, loads are tuned. The tuning may result in a plurality of sets of tuned loads. Each set of tuned loads may correspond to each sinusoidal signal of a plurality of sinusoidal signals within a bandwidth of each of the band groups. In one embodiment, only the loads associated with the signal path of the band group selected are tuned. In this embodiment, the selecting occurs prior to the tuning. In other embodiments, all signal paths are tuned according to each band group available. The tuning may include changing the capacitance of the load. The tuning may change the center frequency of the load, for example. Each frequency synthesized may have a unique filter associated with the band group selected. Each unique filter may correspond to a set of tuned loads.

At 503, the biases are set. The setting of the biases may result in a plurality of sets of bias settings. Each set of bias settings may correspond to each sinusoidal signal of the plurality of sinusoidal signals within a bandwidth of each of the band groups. In one embodiment, only the loads associated with the signal path of the band group selected are set. In this embodiment, the selecting occurs prior to the setting. In other embodiments, all signal paths are set according to each band group available. The setting may include changing the gain of a stage corresponding to a signal path associated with the bandwidth of each of the band groups, for example. The changing of the gain may adjust the output amplitude to the desired value of the signals being synthesized. The setting of the biases may be calibrated in conjunction with the tuning the loads. For example, a bias setting may be increased in order to adjust the gain of one stage to compensate for attenuation caused by a tuned load.

At 504, the sinusoidal signals are multiplexed. The sinusoidal signals may be multiples of a base frequency as described above in FIG. 1. The multiplexing results in a first signal. Each sinusoidal signal may have a unique frequency and the multiplexing may result in the first signal having signals which "hop" from one frequency to another within the band group. The order of multiplexing between the sinusoidal signal may be done according to a protocol, for example.

At 505, the sets of tuned loads are multiplexed. The multiplexing of the sets of tuned loads may be simultaneous to the multiplexing of the sinusoidal signals. The multiplexing of the sets of tuned loads may allow for each synthesized signals to have a corresponding LPF which may filter out any spurious frequency content.

At 506, the sets of bias settings are multiplexed. The multiplexing of the sets of bias settings may be simultaneous to the multiplexing of the sinusoidal signals. The multiplexing of the bias settings may allow for each synthesized signal to have a corresponding gain adjustment which may allow for the synthesized signal to have an improved signal to noise ratio.

At 507, the first signal is mixed with a band signal corresponding to the band group selected. The mixing results in a second signal. The first signal may have a frequency corresponding to a first multiple of a base frequency. The band frequency may have a frequency corresponding to a second multiple of the same base frequency. The band group selected may determine the second multiple and therefore determine the frequency band associated with the band group selected. The second multiple may be an order of magnitude greater than the first multiple. For example, the first multiple may be 4, 6, or 8 as the inputs (×4, ×6, and ×8) of the multiplexer 101 described in FIG. 1 above, and the second multiple may be 21 as described in band group 1 above.

At 508, the transmitter mixer signal and the receiver mixer signal are provided. The transmitter mixer signal and the receiver mixer signal may correspond to the second signal. The signal path of each of these output signals may have unique loads depending on the signal path taken by each of the signals. The signal paths associated with unselected band groups may be muted or turned off so that the signals associated with the band group selected may propagate without interference or cross coupling. This may also reduce power dissipation and increase the usable bandwidth.

The above description illustrates various embodiments of the present invention along with examples of how aspects of the present invention may be implemented. The above examples and embodiments should not be deemed to be the only embodiments, and are presented to illustrate the flexibility and advantages of the present invention as defined by the following claims. Based on the above disclosure and the following claims, other arrangements, embodiments, implementations and equivalents will be evident to those skilled in the art and may be employed without departing from the spirit and scope of the invention as defined by the claims.

What is claimed is:

1. A frequency synthesizer comprising:
    a multiplexer coupled to receive a plurality of sinusoidal signals, each sinusoidal signal having a unique, frequency; and
    a band group selector to selects between a plurality of band groups, the band group selector coupled to receive a first signal from the multiplexer,
    wherein the multiplexer multiplexes between the plurality of sinusoidal signals and provides the first signal,
    wherein the band group selector includes a band mixer, the band mixer mixes the first signal with a sinusoidal band signal having a band frequency, the band signal corresponding to a band group selected from the plurality of band groups, the band mixer providing a second signal,
    wherein the band group selector provides a transmitter mixer signal and a receiver mixer signal corresponding to the second signal,
    wherein the unique frequency corresponds to a first multiple of a base frequency,
    wherein the band frequency corresponds to a second multiple of the base frequency,
    wherein the second multiple is greater than the first multiple.

2. The frequency synthesizer of claim 1 further comprising:

phase locked loop which generates the band signal for a first band group and a second band group, wherein the band mixer mixes the first signal with the band signal resulting in the second signal having a first frequency corresponding to the second multiple minus the first multiple, wherein the band mixer mixes the first signal with the band signal resulting in the second signal having a second frequency corresponding to the second multiple plus the first multiple.

3. The frequency synthesizer of claim 2 wherein the phase locked loop generates a second band signal for a third band group, wherein the third band group utilizes the band mixer of the second band group to mix the first signal with the second band signal resulting in the second signal having a third frequency corresponding to a third multiple minus the first multiple, wherein the second band signal is generated by the phase locked when the third band group becomes the band group selected.

4. The frequency synthesizer of claim 2 wherein each band group of the plurality of band groups includes tuning loads which are altered according to each sinusoidal signal multiplexed within each bandwidth corresponding to each band group, wherein the tuning loads are multiplexed simultaneously with the multiplexer such that a unique tuning load corresponds to each sinusoidal signal multiplexed and the band group selected, wherein the unique tuning load filters out spurious signals.

5. The frequency synthesizer of claim 4 wherein the sinusoidal signals, the first signal, the second signal, the band signal, the transmitter mixer signal, and the receiver mixer signal are differential quadrature signals, wherein each tuning load is a differential tuning load, each differential tuning load comprising:

a differential inductor having a first terminal, a second terminal, and a center tap terminal, the center tap terminal coupled to a first reference voltage; and a plurality of adjustable metal oxide semiconductor capacitor pairs arranged in parallel, each metal oxide semiconductor capacitor pair comprising, a first metal oxide semiconductor capacitor having a channel terminal and a gate terminal, the gate terminal coupled to the first terminal of the differential inductor, a second metal oxide semiconductor capacitor having a channel terminal coupled to the channel terminal of the first metal oxide semiconductor capacitor and a gate terminal coupled to the second terminal of the differential inductor, a first switch having a first terminal coupled to a second reference, voltage and a second terminal coupled to the channel terminal of the first and second metal oxide semiconductor capacitors, and a second switch having a first terminal coupled to a third reference voltage and a second terminal coupled to the channel terminal of the first and second metal oxide semiconductor capacitors, wherein each metal oxide semiconductor capacitor pair is selectively switched such that the load may be tuned.

6. The frequency synthesizer of claim 5 wherein the third reference is ground.

7. The frequency synthesizer of claim 5 wherein the first reference and the second reference are the same.

8. The frequency synthesizer of claim 4 wherein each band group of the plurality of band groups includes bias settings of stages which are altered according to each sinusoidal signal multiplexed within each bandwidth corresponding to each band group, wherein the bias settings are, multiplexed simultaneously with the, multiplexer such that a unique biasing corresponds to each sinusoidal signal multiplexed and the band group selected.

9. The frequency synthesizer of claim 8 wherein the band group selector includes:

a signal branch for each band group; and a wideband buffer coupled to an output of each signal branch, wherein the wideband buffer provides the transmitter mixer signal and the receiver mixer signal corresponding to the band group selected, wherein a signal branch corresponding to the band group selected is the only signal branch powered.

10. The frequency synthesizer of claim 4 wherein each tuning load comprises: an inductor; and a plurality of metal oxide, semiconductor capacitors arranged in parallel, each metal oxide semiconductor capacitor having a common terminal coupled to the inductor, wherein each metal oxide semiconductor capacitor is selectively switched such that the load may be tuned.

11. The frequency synthesizer of claim 10 further comprising:

a controller coupled to selectively switch the plurality of metal oxide semiconductor capacitors; and memory coupled to the controller to execute a calibration routine which tunes the tuning loads.

12. A method of synthesizing signals comprising:

selecting a band group from a plurality of band groups, each band group having a corresponding bandwidth and a band signal having a band frequency, the selecting resulting in a selected band group; and multiplexing between sinusoidal signals of a plurality of sinusoidal signals, each sinusoidal signal having a unique frequency, the multiplexing resulting in a first signal, mixing the first signal with a sinusoidal band signal corresponding to the selected band group, the band signal having a band frequency, the mixing resulting in a second signal, coupling the second signal to provide the transmitter mixer signal and the receiver mixer signal, wherein the unique frequency corresponds to a first multiple of a base frequency, wherein the band frequency corresponds to a second multiple of the base frequency, wherein the second multiple is greater than the first multiple.

13. The method of claim 12 wherein the mixing the first signal further includes:

mixing the first signal according to a first band group such that the second signal has a first frequency corresponding to the second multiple minus the first multiple; and mixing the first signal according to a second band group such that the second signal has a second frequency corresponding to the second multiple plus the first multiple, wherein the plurality of band groups includes the first band group and the second band group, wherein the mixing depends on the band group selected.

14. The method of claim 13 further comprising tuning loads, the, tuning resulting in a plurality of sets of tuned loads, each set of tuned loads corresponding to each sinusoidal signal within each bandwidth corresponding to each band group; and multiplexing between the plurality of sets of turned loads simultaneously with the multiplexing between the sinusoidal signals of the plurality of sinusoidal signals such that each set of tuned loads corresponds to each sinusoidal signal and the band group selected.

15. The method of claim 14 wherein tuning loads includes switching at least one capacitor of at least one load comprising an inductor and the at least one capacitor.

16. The method of claim 14 further comprising setting biases, the setting resulting in a plurality of sets of bias settings, each set of bias settings corresponding to each sinusoidal signal within each bandwidth corresponding to each band group; and multiplexing between the plurality of sets of bias settings simultaneously with the multiplexing between the sinusoidal signals of the plurality of sinusoidal signals such that each set of biasing settings corresponds to each sinusoidal signal and the band group selected.

17. The method of claim 16 wherein the setting biases changes the gain of a mixer corresponding to a signal path of the band group selected.

18. The method of claim 16 wherein the setting biases changes the gain of a stage corresponding to a signal path of the band group selected.

* * * * *